US009148012B2

(12) United States Patent
Seidl et al.

(10) Patent No.: US 9,148,012 B2
(45) Date of Patent: Sep. 29, 2015

(54) CIRCUIT ARRANGEMENT AND METHOD FOR EVALUATING A SIGNAL

(71) Applicant: Infineon Technologies AG, Neubiberg (DE)

(72) Inventors: Christoph Seidl, Graz (AT); Martin Kaltenegger, Graz (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 280 days.

(21) Appl. No.: 13/803,151

(22) Filed: Mar. 14, 2013

(65) Prior Publication Data
US 2014/0268442 A1   Sep. 18, 2014

(51) Int. Cl.
| | |
|---|---|
| H02H 9/00 | (2006.01) |
| H02H 3/20 | (2006.01) |
| G01D 3/08 | (2006.01) |
| G01R 1/36 | (2006.01) |
| G01C 13/00 | (2006.01) |
| G01P 3/46 | (2006.01) |
| G01P 3/481 | (2006.01) |
| G01R 19/00 | (2006.01) |

(52) U.S. Cl.
CPC ............... *H02H 3/207* (2013.01); *G01C 13/00* (2013.01); *G01D 3/08* (2013.01); *G01P 3/46* (2013.01); *G01P 3/481* (2013.01); *G01R 1/36* (2013.01); *G01R 19/0084* (2013.01)

(58) Field of Classification Search
CPC .................................................. H03K 17/0822
USPC ....................................................... 361/91.1
See application file for complete search history.

(56) References Cited

U.S. PATENT DOCUMENTS

| | | | | |
|---|---|---|---|---|
| 3,767,972 A | * | 10/1973 | Noddings et al. | 361/240 |
| 3,882,328 A | | 5/1975 | Mazgy et al. | |
| 3,969,677 A | * | 7/1976 | Woyton | 327/29 |
| 4,454,428 A | * | 6/1984 | Kimmel et al. | 290/40 R |
| 4,940,907 A | * | 7/1990 | Laude | 327/73 |
| 5,023,490 A | * | 6/1991 | Gittinger | 327/309 |
| 5,929,576 A | * | 7/1999 | Yasohara et al. | 318/400.22 |
| 6,777,925 B1 | | 8/2004 | Seidenfuss | |
| 7,080,300 B1 | * | 7/2006 | Herron et al. | 714/726 |
| 2010/0305465 A1 | | 12/2010 | Ricks et al. | |

FOREIGN PATENT DOCUMENTS

DE    19954115 C1    4/2001

OTHER PUBLICATIONS

TLE8080EM, Engine Management IC for Small Engines, Data Sheet, Rev. 1.0, Aug. 29, 2012, 38 pages.
Bosch GmbH, Data Sheet, CY 30B, Oct. 25, 2004, 15 pages.
L9779, Multifunction IC for Engine Management System, Rev. 1.1.7 Jan. 7, 2011, 142 pages.

* cited by examiner

Primary Examiner — Stephen W Jackson

(57) ABSTRACT

Circuit arrangement including an interface, a protection circuit and a measurement circuit. The interface is configured to receive a signal. The protection circuit is coupled to the interface. The protection circuit is configured to limit a voltage provided by the interface to a protection voltage. The measurement circuit is coupled to the protection circuit and configured to provide at least one of a signal of a first measurement type and a signal of a second measurement type if a voltage provided by the interface is higher than the protection voltage and configured to provide a signal of a second measurement type if the voltage provided by the interface is lower than the protection voltage.

23 Claims, 4 Drawing Sheets

CIRCUIT ARRANGEMENT AND METHOD FOR EVALUATING A SIGNAL

TECHNICAL FIELD

Various embodiments relate generally to a circuit arrangement and a method for evaluating a signal.

BACKGROUND

Frequently, signals with a large dynamic range need to be evaluated. Such a signal may, for example, be provided by a variable reluctance sensor. A variable reluctance sensor may be used to measure a speed of rotation, for example of an automotive crankshaft, camshaft, transmission shaft, etc. Speeds of rotation in the range from 0 rpm to 10,000 rpm may need to be measured. Teeth of a rotating toothed wheel may change a magnetic flux through a ferromagnetic pole when passing by the ferromagnetic pole. The magnetic flux increases when a tooth approaches the ferromagnetic pole and decreases when a tooth leaves the ferromagnetic pole. A coil arranged around the ferromagnetic pole may be used to detect a change in magnetic flux. The teeth of the rotating toothed wheel may induce an alternating voltage in the coil. The amplitude and the frequency of the induced voltage may depend on the speed of rotation. Increasing the speed of rotation may increase both the amplitude and the frequency of the induced voltage. The amplitude of the induced voltage may range from about 10 mVpp at low speeds of rotation to about 400 Vpp at high speeds of rotation.

The amplitude of the induced voltage may be clipped or, in other words, be sliced or clamped at a protection voltage. The clipped voltage may have the same shape as the induced voltage for induced voltages smaller in magnitude than the protection voltage. The amplitude of the clipped voltage will not exceed the protection voltage. Therefore, if the protection voltage is chosen small enough, the clipped voltage will not damage electronic devices by exceed a maximum allowable voltage of the electronic device. Further, the reduced voltage range may easily be measured and processed.

However, clipping the induced voltage may degenerate the signal-to-noise ratio of the signal. This may especially be true for noise caused by mechanical irregularities of the toothed wheel, for example, noise caused by bent teeth or leftovers in the gaps between the teeth after punching the teeth, since they have the same frequency as the desired signal. Further, information about the speed of rotation that may be derived from the amplitude may be lost.

SUMMARY

In various embodiments, a circuit arrangement is provided, including an interface, a protection circuit and a measurement circuit. The interface may be configured to receive a signal. The protection circuit may be coupled to the interface. The protection circuit may be configured to limit a voltage provided by the interface to a protection voltage. The measurement circuit may be coupled to the protection circuit and configured to provide at least one of a signal of a first measurement type and a signal of a second measurement type if a voltage provided by the interface is higher than the protection voltage and configured to provide a signal of a second measurement type if the voltage provided by the interface is lower than the protection voltage.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
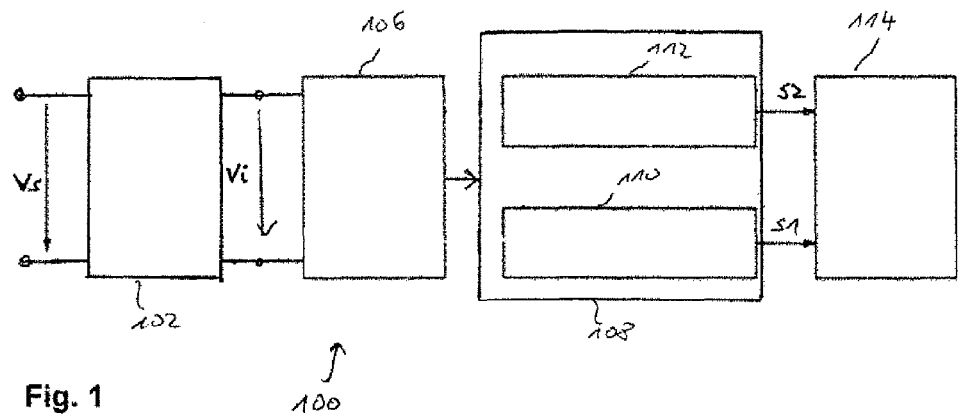
FIG. 1 shows a circuit arrangement in accordance with various embodiments.

FIG. 1 shows a circuit arrangement 100 in accordance with various embodiments. The circuit arrangement may include an interface 102, a protection circuit 106, a measurement circuit 108 and a signal processing circuit 114. The circuit arrangement 100 may be configured to evaluate a signal Vs. Signal Vs may have a large dynamic range, for example with voltages between 10 mVpp to 400 Vpp. Signal Vs may be generated by a sensor. The sensor may be a variable reluctance sensor.

A variable reluctance sensor may be provided to measure a speed of rotation, for example of an automotive crankshaft, camshaft, transmission shaft, etc. Speeds of rotation in the range from 0 rpm to 10,000 rpm may need to be measured. Teeth of a rotating toothed wheel may change a magnetic flux through a ferromagnetic pole when passing by the ferromagnetic pole. The magnetic flux increases when a tooth approaches the ferromagnetic pole and decreases when a tooth leaves the ferromagnetic pole. A coil arranged around the ferromagnetic pole may be used to detect a change in magnetic flux. The teeth of the rotating toothed wheel may induce an alternating voltage in the coil. The amplitude and the frequency of the induced voltage may depend on the speed of rotation. Increasing the speed of rotation may increase both the amplitude and the frequency of the induced voltage. The amplitude of the induced voltage may range from about 10 mVpp at low speeds of rotation to about 400 Vpp at high speeds of rotation.

Signal Vs may be an alternating signal and may be symmetric about a reference potential, for example, a ground potential. However, signal Vs may also only have one polarity or alternate about another potential than the ground potential.

The interface 102 may be a sensor interface and may be configured to receive the signal Vs and may output a signal, for example a voltage Vi. The interface 102 may load the signal Vs, for example if the signal Vs is an induced voltage. It may include resistances to limit a current flow, to reduce sensitivity or to increase a resolution. It may be optional, for example if signal Vs can be directly processed by the measurement circuit 108.

The protection circuit 106 may be coupled to the interface 102. The protection circuit 106 may limit the voltage Vi provided by the interface 102 to a protection voltage Vp. In other words, a voltage provided by the protection circuit 106 does not exceed the protection voltage Vp. The signal Vi may be clipped or cut off or sliced off by the protection circuit 106 when the voltage Vi is greater than the protection voltage Vp. In other words, the amplitude of the signal Vi may be limited to the protection voltage and the shape of the signal Vi may remain unchanged when the voltage Vi is smaller than the protection voltage Vp. The protection voltage Vp may be a maximum operating voltage, for example, of electronic devices, of the measurement circuit 108 or of the signal processing circuit 114. It may be a maximum allowable electrostatic discharge (ESD) voltage of an electronic device.

The measurement circuit 108 may be coupled to the protection circuit 106. It may provide a signal S1 of a first measurement type if the voltage Vi provided by the interface 102 is higher than the protection voltage Vp. It may include a first measuring circuit 110 to provide the signal S1 of the first measurement type. The signal S1 of the first measurement type may be used for measuring large speeds of revolution where the voltage Vs is larger than the protection voltage Vp. The signal S1 may be present when the signal Vi is clipped or shunted.

The first measurement type may represent a current through the protection circuit 106. The signal Vi may be clipped, for example, by shunting signal Vi by the protection circuit 106. The measurement of the current through the protection circuit 106 may be used to provide further information about the voltage Vi and the voltage Vs when the voltage Vi is clipped to the protection voltage Vp. For example, the amplitude of the unclipped signal Vi may be determined from the amplitude of the current. Further, a frequency of signal Vi may be determined from the current, for example from the time differences between peaks of the current.

The measurement circuit 108 may provide a signal S2 of a second measurement type if the voltage Vi provided by the interface 102 is lower than the protection voltage Vp. It may include a second measuring circuit 112 to provide the signal S2 of the second measurement type. The signal S2 of the second measurement type may be used to detect low speeds of revolution, for example during start-up or idling of an internal combustion engine.

The second measurement type may represent a voltage across the protection circuit 106. The voltage Vi is not shunted when the voltage provided by the interface 102 is higher than the protection voltage Vp. Signal S2 may have the same signal shape as the voltage Vi and an amplitude and a frequency of voltage Vi may be determined from signal S2.

The second measurement circuit 112 may also provide a signal S2 of the second measurement type if the voltage Vi provided by the interface 102 is higher than the protection voltage Vp. The voltage Vi may be shunted and signal S2 may have a different shape than voltage Vi. However, signal S2 may have the same zero-crossings as voltage Vi so that the frequency of voltage Vi and Vs may be determined from signal S2. Determining the frequency of voltage Vi and Vs using zero-crossings of signal S2 may be easier or more accurate than determining the frequency of voltage Vi and Vs using time differences between peaks of signal S1.

The signal processing circuit 114 may process signal S1 of the first measurement type and signal S2 of the second measurement type. If the voltage Vi provided by the interface 102 is lower than the protection voltage Vp, signal S2 may be evaluated. In this case, there may be no signal S1 present and only a second measurement type may be possible. A frequency and an amplitude of voltage Vi may be determined from signal S2. A speed of rotation may be determined from each of the frequency and the amplitude.

If the voltage Vi provided by the interface 102 is higher than the protection voltage Vp, signal S1 may be present and may be evaluated. An amplitude of voltage Vi may be determined from signal S1 and a speed of rotation may be determined from the amplitude. Signal S1 may be evaluated alone. However, both the first measurement type and the second measurement type may be performed. The second measurement type will give additional information about zero-crossings of the voltage Vi. The information about zero-crossings may be used to determine the frequency of voltage Vi and a speed of rotation may be determined from the frequency. The first measurement type will provide additional information about the amplitude of signal Vs which is lost in the clipping by the protection circuit. The signal processing circuit 114 may combine signal S1 and signal S2 to increase the signal noise ratio (SNR) of the signal that is of interest, which may for example be a phase, a frequency or an amplitude.

Figure 2:
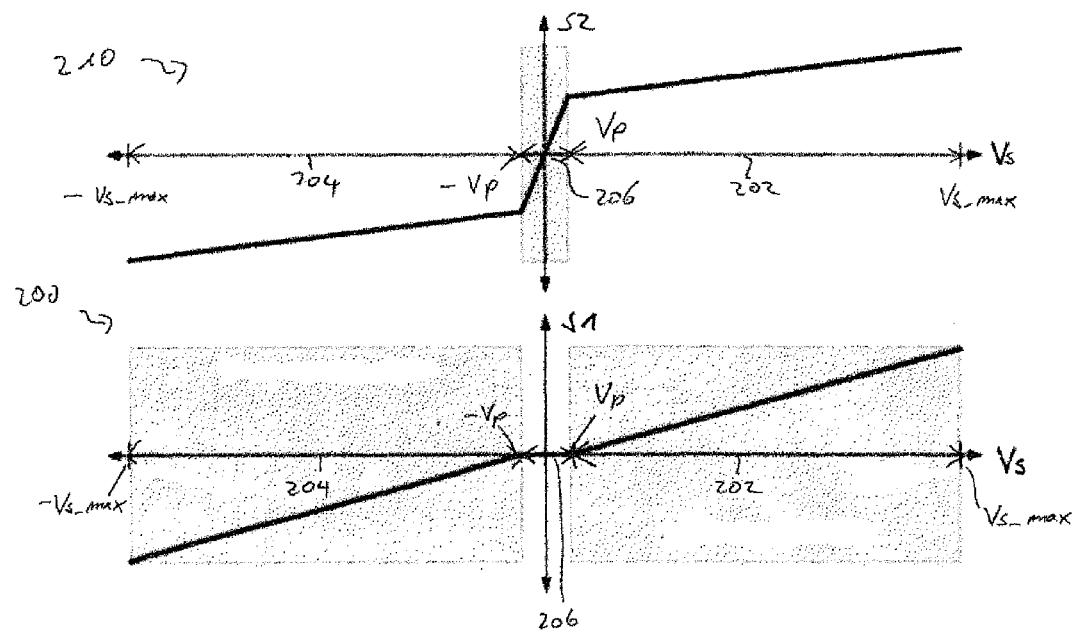
FIG. 2 shows signals of a first measurement type and of a second measurement type in accordance with various embodiments.

FIG. 2 shows a diagram 200 of a signal S1 of the first measurement type and a diagram 210 of a signal S2 of the second measurement type of an embodiment of the circuit arrangement. Depending on the value of signal Vs, the circuit arrangement may have three areas of operation: a first operating area 202 for signals Vs between Vp and Vs_max, a second operating area 204 for signals Vs between −Vp and −Vs_max and a third operating area 206 for signals Vs between −Vp and Vp. Vp may be the protection voltage of protecting circuit 106.

Signal Vs may be a sensor signal or any other kind of signal. It may have a maximum value Vs_max and a minimum value of −Vs_max. Vs_max may for example be the maximum voltage produced by a variable reluctance sensor, for example at a maximum speed of revolution. The maximum speed of revolution may be about 10,000 rpm and Vs_max may be about 200 V, giving a voltage range of about 400 Vpp.

The protection voltage Vp may be chosen to limit the signal Vs to voltages low enough to be safely processed by the measuring circuit 108 and the signal processing circuit 114. The protection voltage Vp may for example be an electronic discharge protection voltage (ESD). −Vp to +Vp may have a range of about 50 Vpp. Alternatively, the protection voltage Vp may for example limit signal Vs to a full range input voltage of an analog digital converter (ADC). It may have a range of about 3 Vpp.

Diagram 200 shows that signal S1 may be provided in the first operating area 202 and the second operating area 204. In these operating areas 202, 204, the first measurement type may be performed. The first measurement type may be a current measurement, for example of the current through the protection circuit 106. The protection circuit 106 may shunt the signal Vs whenever signal Vs is greater than the protection voltage Vp or lower than the protection voltage −Vp. A current may then flow through the protection circuit 106 and signal S1 may represent the current flow through the protection circuit 106. An increase in signal Vs may increase the current flow through the protection circuit 106 and may result in a larger signal S1. The increase in the current flow and in signal S1 may be proportional to the increase in signal Vs.

In the third operating area 206, signal Vs lies between the protection voltages −Vp and Vp. The protection circuit 106 does not need to shunt signal Vs, so that no current flows through the protection circuit 106 and the first measurement type cannot be performed. Signal S1 may be zero in the third operating area 206.

Diagram 210 shows that a signal S2 may be provided in the first operating area 202, the second operating area 204 and the third operating area 206. In these operating areas 202, 204, 206, the second measurement type may be performed. The second measurement type may be a voltage measurement, for example across the protection circuit 106.

In the third operating area 206, signal Vs lies between the protection voltages −Vp and Vp and is not clipped by the protection circuit 106. Signal S2 may then have the same shape as signal Vs and be proportional to it.

Figure 3:
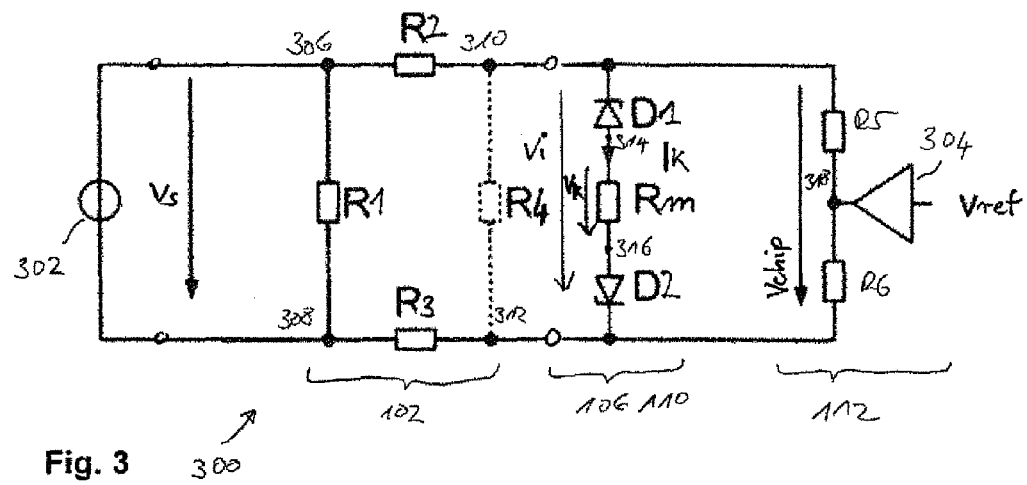
FIG. 3 shows a circuit arrangement in accordance with various embodiments.

In the first operating area 202 and the second operating area 204, signal Vs is clipped by the protection circuit 106. In various embodiments, signal S2 would not exceed the protection voltage Vp and be horizontal, that is parallel to the axis labeled Vs and independent of the magnitude of signal Vs. However, performing the first measurement type may cause signal S2 to increase with the magnitude of signal Vs. This may, for example, be caused by voltage drops along resistors R2, R3 in the interface 102 or along shunt elements resistor Rm and the intrinsic resistance of the diodes D1, D2, as is shown in FIG. 3. An increase in current Ik flowing may cause Vchip, which may represent signal S2, to increase.

FIG. 3 shows a circuit arrangement 300 in accordance with various embodiments. The circuit arrangement 300 may include a variable reluctance sensor 302, as already described above, to provide the signal Vs.

The interface 102 may include a first resistor R1, a second resistor R2 and a third resistor R3. The first resistor R1 may be coupled across signal Vs, between nodes 306 and 308. The second resistor R2 may be coupled with one terminal to node 306 to one polarity of the signal Vs. Another terminal of the second resistor R2 may be coupled to node 310. The third resistor R3 may be coupled with one terminal to node 308 to another polarity of signal Vs. Another terminal of the third resistor R3 may be coupled to node 312. The first resistor R1 may have a value in the range from about 1 kOhm to about 50 kOhm. The first resistor R1 may be optional. The second resistor R2 and third resistor R3 may each have a value in the range from about 1 kOhm to about 50 kOhm. The interface 102 may provide a voltage Vi between node 310 and node 312. A fourth resistor R4 coupled between nodes 310 and 312 is no longer necessary, so that the number of components of the circuit arrangement may be reduced.

The protection circuit 106 may include at least one diode D1, D2. The at least one diode D1, D2 may be a reverse biasable diode. The at least one diode D1, D2 may be a zener diode or an avalanche diode, which is coupled to the voltage Vi provided by the interface 102. The at least one diode D1, D2 may have a well defined reverse breakdown voltage. The reverse breakdown voltage may for example be 3.2 V or 5.6 V or any other voltage. The reverse breakdown voltage may define or be equal to the protection voltage Vp of the circuit arrangement.

The at least one diode D1, D2 may be coupled to the voltage Vi provided by the interface 102, for example via nodes 310, 312. Voltage limiting may be achieved by reverse biasing one of the diodes D1, D2 for each polarity of the half waves of signal Vi. In various embodiments, a first diode D1 may be reverse biased for a positive half wave of signal Vi and a second diode D2 may be reverse biased for a negative half wave of signal Vi. The at least two diodes D1, D2 may be coupled in series and with opposite polarities to each other— that is, the respective cathodes or the respective anodes may be coupled together—between the voltage Vi provided by the interface 102.

The measurement circuit 108 may include at least one resistor Rm coupled between the at least one diode D1, D2. The first diode D1 may be coupled between two nodes, e.g. a first node 310 and a second node 314. Its cathode may be coupled to the first node 310 and its anode may be coupled to the second node 314. The second diode D2 may be coupled between two other nodes, e.g. a third node 312 and a fourth node 316. Its cathode may be coupled to the third node 312 and its anode may be coupled to the fourth node 316. The polarity of each of the first diode D1 and the second diode D2 may be reversed. The resistor Rm may be coupled between the first second node 314 and the fourth node 316. A voltage Vk across the resistor Rm may provide a signal S1 of the first measurement type. The resistor Rm may be part of the first measurement circuit 110.

The current Ik flowing through the protection circuit 106 may be calculated by measuring the voltage Vk across the resistor Rm and applying Ohm's law as follows:

$$Ik=Vk/Rm. \qquad (1)$$

A voltage Vchip across the protection circuit 106 or the voltage Vi provided by the interface 102 may be provided as the signal S2 of the second measurement type. Resistors R5 and R6 may be coupled to other in series at a fifth node 318 between the voltage Vi. They may be part of the second measurement circuit 112 and may be used for limiting current flow when the circuit arrangement is operating in the third operating area 206. Resistors R5 and R6 may be used for scaling the voltage Vchip.

A buffer amplifier 304 may be coupled to the fifth node 318 and may be used to provide a voltage reference for the circuit arrangement. The buffer amplifier 304 may output a voltage at the fifth node 318 that may be proportional or equal to a reference voltage Vref applied to an input of the buffer amplifier 304. Vref may be a ground potential. Vref may bias Vchip, for example, so that Vchip is in the middle of a measuring range of an analog digital converter (ADC) of the signal processing circuit 114. The buffer amplifier 304 may be optional, for example if the ADC does not require a reference potential.

In the third operating area 206, that is, when the magnitude of signal Vs and consequently of voltage Vi provided by the interface 102 is low enough, at least one of the diodes D1, D2, will not be conducting as it will not be reverse biased enough to start conducting. There will be no current Ik flowing through the diodes D1, D2 and the resistor Rm. A first type measurement cannot be made and no signal S1 is provided, as is shown in diagram 200 of FIG. 2. A second type measurement can be made and signal S2, which may correspond to Vchip, may be provided, as is shown in diagram 210 of FIG. 2.

In the first operating area 202 and the second operating area 204, that is when the magnitude of signal Vs and consequently of voltage Vi provided by the interface 102 is large enough, one of the diodes D1, D2, will be reverse biased conducting and the other of the diodes D1, D2, will be forward biased conducting. Current Ik will flow through diodes D1, D2, and resistor Rm. A first type measurement to provide signal S1 may be made, as is shown in diagram 200 of FIG. 2. The current Ik may be calculated from Vk and Rm. The current Ik may represent the amplitude of signal Vs and a speed of rotation may be determined from the amplitude. A second type measurement may also be made and signal S2, which may correspond to Vchip, may be provided. In contrast to the first operating area 202, Vchip corresponds to a clipped signal Vs, as is shown in diagram 210 of FIG. 2, and amplitude information is lost. However, frequency information of signal Vs may be determined, for example by detecting and evaluating zero-crossing of signal Vchip. The first type measurement and the second type measurement may be made at the same time. Both signals S1 and S2 may contain information about signal Vs. The first measurement type will provide additional information about the amplitude of signal Vs which is lost in the clipping by the protection circuit. The signal processing circuit 114 may combine signal S1 and signal S2 to increase the signal noise ratio (SNR) of the signal that is of interest, which may for example be a phase, a frequency or an amplitude.

Figure 4:
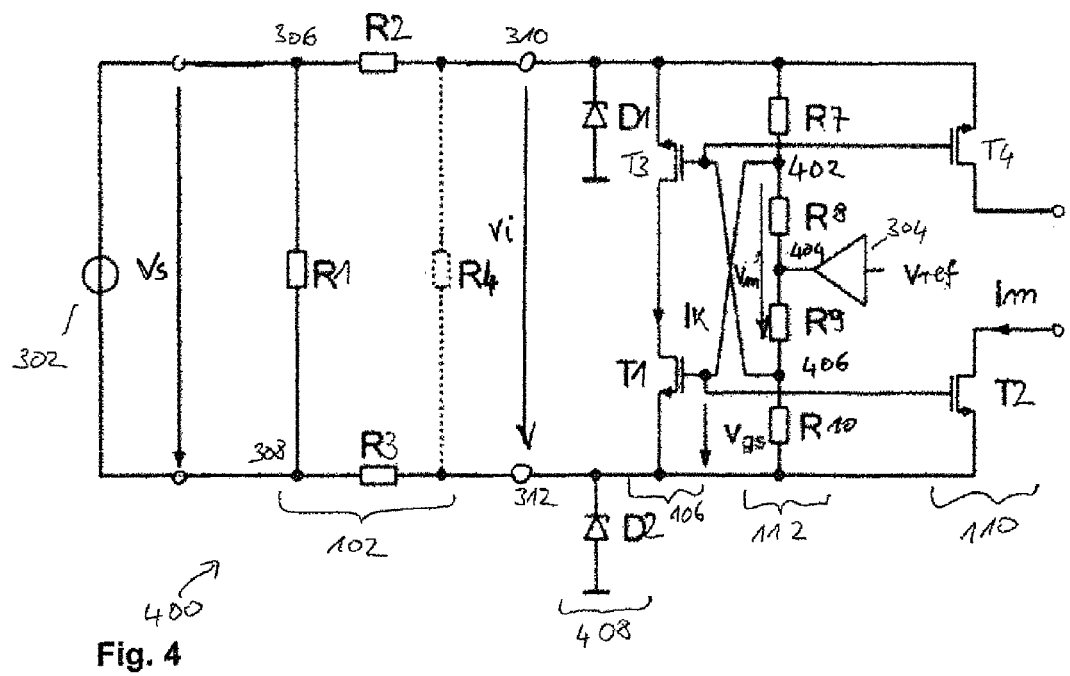
FIG. 4 shows a circuit arrangement in accordance with various embodiments.

FIG. 4 shows a circuit arrangement 400 in accordance with various embodiments, which may be identical to the embodiment 300 shown in FIG. 3 with regard to the source 302 of signal Vs, the interface 102, and the diodes D1, D2. However, the diodes D1, D2, are each coupled with their respective cathode to the voltage Vi provided by the circuit interface 102 and with their respective anode to a ground potential. There is no resistor Rm provided for measuring the current through the diodes D1, D2. Instead, the diodes D1, D2, form a further protection circuit 408 and may be used for ESD protection. They may have a reverse breakdown voltage of about 50 V which may be called a further protection voltage Vp2. The diodes D1, D2 are optional.

The protection circuit 106 may have a transistor T1 and a transistor T3 coupled in series with each other between the voltage Vi provided by the interface 102 at the first node 310 and the third node 312. The third embodiment 400 may have four resistors R7, R8, R9, R10 coupled in series to each other between the voltage Vi provided by the interface 102. The resistance of the four resistors R7, R8, R9, and R10 may be chosen to bias transistors T1 and T3. They may be used to set the protection voltage Vp. They may have the same resistance. The gate of transistor T1 is coupled to node 402 at which the resistors R7, R8 are coupled to each other. The gate of transistor T3 is coupled to node 406 at which the resistors R9, R10 are coupled to each other.

When Vi exceeds a protection voltage Vp, both transistors T1, T3 are conductive and a shunt current Ik will flow through the transistors T1, T3. During a positive half wave of voltage Vi, the transistor T3 is configured as a diode and the transistor T1 is configured as a transistor. During a negative half wave of voltage Vi, transistor T1 is configured as a diode and transistor T3 is configured as a transistor. An increase in magnitude Vi will control the transistor T1, T3 configured as a transistor to conduct more so that a large current Ik flows and the voltage across node 310, 312 is limited. When Vi is lower than a protection voltage Vp, the transistor T1, T3 configured as a transistor will not conduct and no shunt current Ik will flow.

The measurement circuit 108 may include a current mirror configured to mirror a current through the protection circuit 106 to provide the signal S1 of the first measurement type. The current mirror may have a first pair of transistors T1, T2 and a second pair of transistors T3, T4, for each half wave of signal Vi, respectively. The gates of the first pair of transistors T1, T2 are coupled to each other and the gates of the second pair of transistors T3, T4 are coupled to each other. During a positive half wave of signal Vi, a current Ik flowing through transistor T1 is mirrored to a current Im flowing through transistor T2 and no current flows through transistor T4. During a negative half wave of signal Vi, a current Ik flowing through transistor T3 is mirrored to a current Im flowing through transistor T4 and no current flows through transistor T2. Currents Ik and Im may be proportional to each other or may be identical to each other, depending on the parameter of the transistors T1, T2, T3, and T4. The first measuring circuit 110 may include the current mirror. Current Ik may be used as signal S1.

Instead of using a current mirror, a resistor can be used for measuring the current, for example as is described in FIG. 3.

An output of an amplifier buffer 304 is coupled to node 404 at which the resistor R8 and resistor R9 are coupled to each other. A reference voltage Vref applied to an input of the amplifier buffer 304 may be used as a reference voltage for the circuit arrangement, as was described in conjunction with FIG. 3. The second measuring circuit 112 may include resistors R8, R9. It may also include resistors R7, R10. A voltage Vm may be measured between nodes 402, 406 and may be used as signal S2. The voltage Vm may be scaled by selecting resistors R8, R9 accordingly.

Figure 5:
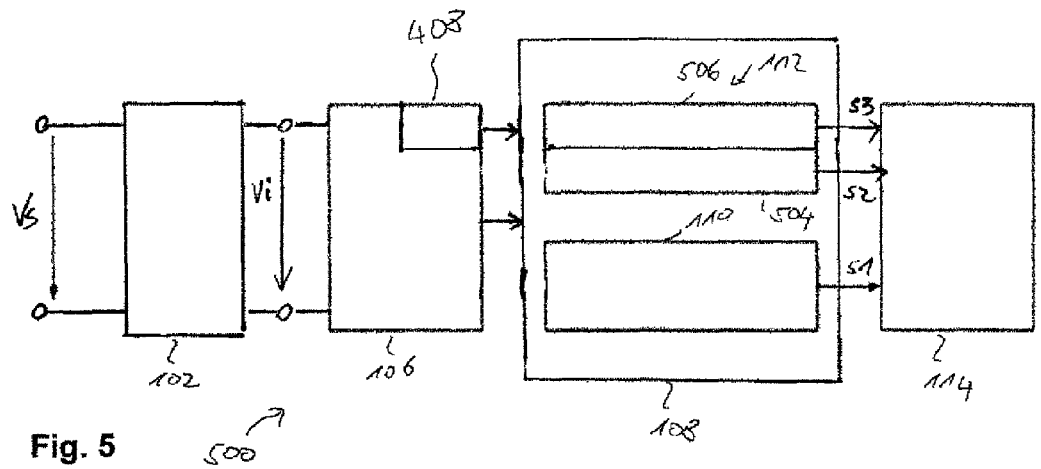
FIG. 5 shows a circuit arrangement in accordance with various embodiments.

FIG. 5 shows a circuit arrangement 500 in accordance with various embodiments. The circuit arrangement 500 may include a further protection circuit 408. The further protection circuit 408 may be coupled to interface 102. The further protection circuit 408 may limit a voltage Vi provided by the interface to a further protection voltage Vp2. The further protection voltage Vp2 may be lower than the protection voltage Vp.

The measurement circuit 108 may have a first measurement circuit 110 for performing a first measurement type and a second measurement circuit 112 for performing a second measurement type. The first measurement type may be a current measurement which may be represented by a signal S1. The second measurement type may be a voltage measurement. The second measurement circuit 112 may have a first voltage measurement circuit 504 and a second voltage measurement circuit 506. The first voltage measurement circuit 504 may measure voltages in the range of the protection voltage Vp and provide a signal S2. The second voltage measurement circuit 506 may measure voltages in the range of the further protection voltage Vp2 and provide a signal S3.

If the protection voltage Vp and the further protection voltage Vp2 differ from each other, the first voltage measurement circuit 504 and the second voltage measurement circuit 506 may measure different ranges of voltages with different resolutions. For example, given an analog digital converter with a fixed number of bits, the first measurement circuit 504 may cover a large voltage range with a low resolution and the second voltage measurement circuit 506 may cover a smaller voltage range with a higher resolution, and vice versa. The larger voltage range may be used to measure a rotation speed of an internal combustion engine while driving a car or while shifting gears. The larger voltage range may be a range in which electronic devices can be safely operated. It may be a maximum allowable electrostatic discharge (ESD) voltage or a maximum allowable pulse defined by the International Organization for Standardization (ISO pulse) The smaller voltage range may be used to measure a rotation speed of the internal combustion engine when starting the engine or when the engine is idling with high accuracy. A standard low voltage analog digital converter (ADC) may be used for voltages in the smaller voltage range and a ramp-compare analog digital converter which may be area optimized may be used for the larger voltage range.

The signal processing circuit 114 may process the signal S1 of the first measurement type and the signals S2, S3 of the second measurement type. Whenever a voltage is clipped, the first measurement type may be performed. Clipping may occur at voltages greater than the protection voltage Vp and at voltages greater than the further protection voltage Vp2.

If the voltage Vi provided by the interface 102 is higher than the protection voltage Vp, a first signal S1 may be evaluated for the clipping at the protecting voltage Vp. A second signal S1 may be evaluated for the clipping at the further protecting voltage Vp2. Signal S2 may be evaluated. Furthermore, also signal S3 may be evaluated.

If the voltage Vi provided by the interface 102 is lower than the protection voltage Vp, there may be no first signal S1 present for the clipping at the protecting voltage Vp. However, the second signal S1 may be present for the clipping at the further protecting voltage Vp2. Signal S2 may be evaluated. Furthermore, also Signal S3 may be evaluated.

If the voltage Vi provided by the interface 102 is lower than the further protection voltage Vp2, there may be no first signal S1 present for the clipping at the protecting voltage Vp and no second signal S1 may be present for the clipping at the further protecting voltage Vp2. However, signal S2 may be evaluated. Signal S3 may also be evaluated.

The first signal S1, the second signal S1, the signal S2 and the signal S3 may be evaluated alone or together in combination with the other signals. The signal processing circuit 114 may combine the signals, was already described above, to suppress noise as the same noise may be present in at least two of the signals. This may increase the signal noise ratio (SNR) when evaluating signal Vs.

Figure 6:
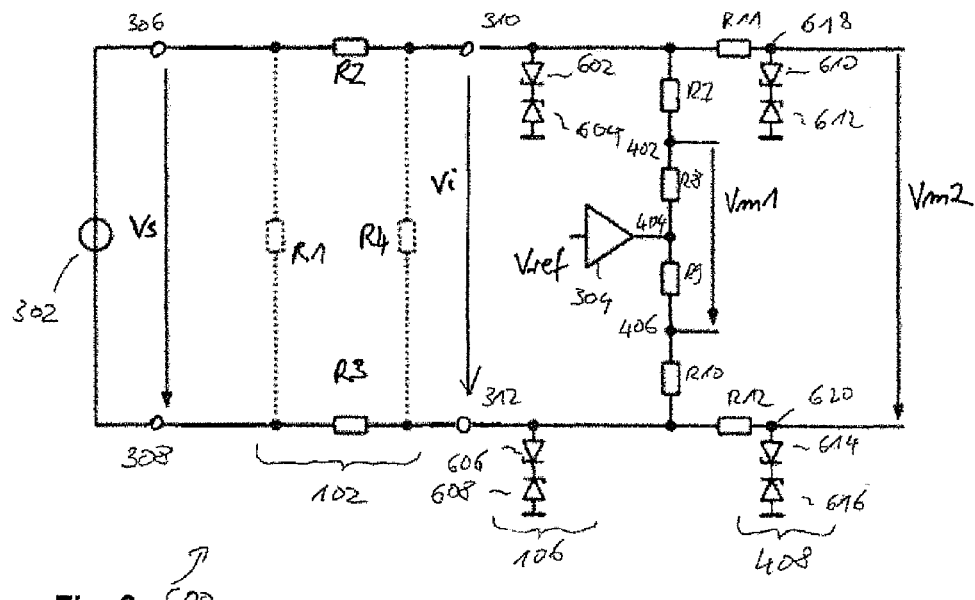
FIG. 6 shows a circuit arrangement in accordance with various embodiments.

FIG. 6 shows a circuit arrangement 600 in accordance with various embodiments, which may be identical to the previous embodiments with regard to the voltage sensor 302 and the interface 102. However, the interface 102 may no longer require resistor R1. For the purpose of illustrating, a current measurement circuit 110 for first measurement types to obtain signal S1 is not shown. However, it may be employed, as is outlined below.

The circuit arrangement 600 may have a protection circuit 106. The protection circuit 106 may be used for electrostatic discharge (ESD) protection. The protection circuit 106 may include two diodes pairs 602, 604 and 606, 608. The diodes in each pair may be coupled in series with each other. In each diode pair, the cathodes of the diodes may be coupled together. The anode of one diode in each pair may be coupled to the voltage Vi provided by the interface 102 and the anode of the other diode in each diode pair may be coupled to a ground potential. Alternatively, in each diode pair, the anodes of the diodes may be coupled together. The cathode of one diode may be coupled to the voltage Vi provided by the interface 102 and the cathode of the other diode in the diode pair may be coupled to a ground potential.

The diodes 602, 604, 606, 608 may be zener diodes or avalanche diodes which may limit voltages when reverse biased. They may have a reverse breakdown voltage equal to the protection voltage Vp. The protection voltage Vp may be a maximum allowable electrostatic discharge voltage (ESD) of an electronic device and may be about 50 V.

The circuit arrangement 600 may have four resistors R7, R8, R9, R10 coupled in series to each other between the voltage Vi provided by the interface 102, as was already described in conjunction with FIG. 4. An output of an amplifier buffer 304 may be coupled to a node 404 at which the resistors R8, R9 are coupled to each other. A reference voltage Vref applied to an input of the amplifier buffer 304 may be used to generate a reference voltage for the circuit arrangement, as was already described in conjunction with FIG. 4. The first voltage measuring circuit 504 of the second measuring circuit 112 may include Resistors R8, R9. A voltage Vm1 may be measured between nodes 402, 406 and may be used as signal S2.

The circuit arrangement 600 may have a further protection circuit 408. The further protection circuit 408 may be used for further restricting the voltage Vi provided by the interface 102 to a smaller range than the protection voltage Vp. For a given number of bits of an analog digital converter (ADC), voltages in a smaller range may be measured with greater resolution than voltages in a larger range.

The further protection circuit 408 may include two diodes pairs 610, 612 and 614, 616. The diodes in each pair may be coupled in series with each other. In each diode pair, the cathodes of the diodes may be coupled together. The anode of one diode in each pair may be coupled to a respective node 618, 620. It may be coupled to the voltage Vi provided by interface 102 via a respective resistor R11, R12. Resistor R11, R12 may form part of the second voltage measurement circuit 506. They may decouple the protection circuit 102 from the further protection circuit 408. Resistor R11 may be coupled between node 310 and 618. Resistor R12 may be coupled between node 312 and 620. Resistor R11, R12 may have a respective resistance value in the range from about 10 kOhm to about 1 MOhm. The anode of the other diode in the diode pair may be coupled to a ground potential. Alternatively, in each diode pair, the anodes of the diodes may be coupled together. The cathodes of one diode in each pair may be coupled to the voltage Vi provided by the interface 102 via the resistor R11, R12 and the cathode of the other diode in the diode pair may be coupled to a ground potential.

The diodes 610, 612, 614, 616 may be zener diodes or avalanche diodes, which may limit voltages when reverse biased. They may have a reverse breakdown voltage equal to the further protection voltage Vp2. The further protection voltage Vp2 may define a voltage range which can be measured with greater resolution than a larger voltage range. For example, the smaller range may correspond to the voltage Vs provided by the variable inductance sensor 302 during start-up or idling of an internal combustion engine. During start-up or idling, the variable reluctance sensor 302 may output a very small signal Vs, for example, in the range of millivolts. The range defined by the further protection voltage Vp2 may be about −3 V to +3 V. A voltage Vm2 may be measured between nodes 618, 620 and may be used as signal S3 of the third measurement type.

When the magnitude of Vi exceeds the protection voltage Vp, both diodes in each of the diode pairs 602, 604 and 606, 608 conduct, respectively for a positive voltage and a negative voltage of Vi. In each diode pair, one diode may be forward conducting and the other reverse conducting. A shunt current Ik may flow through one of the diode pairs and may be used as a signal S1. Shunt current Ik may be measured as described in conjunction with FIG. 3 via a shunt resistor Rm. When the diode pairs 602, 604 and 606, 608 are replaced with transistors T1 and T3, shunt current Ik may be also be measured via a current mirror as described in conjunction with FIG. 4.

When the magnitude Vi is lower than the protection voltage Vp, no shunt current Ik will flow as the voltage is not large enough to reverse bias one of the diodes in the diode pairs 602, 604 and 606, 608. The voltage Vm1 may have the same shape as voltage Vi provided by the interface 102.

When the magnitude of the voltage between nodes 618, 620 exceeds the further protection voltage Vp2, both diodes in the diode pairs 610, 612 and 614, 616 conduct, respectively for a positive voltage and a negative voltage of Vi. In each pair, one diode will be forward conducting and the other reverse conducting. A further shunt current Ik may flow through one of the diode pairs 610, 612 and 614, 616 and may be used as another signal S1. The further shunt current Ik may be measured as described in conjunction with FIG. 3 via a further shunt resistor Rm. When the diode pairs 610, 612 and 614, 616 are replaced with transistors T1 and T3, the further shunt current Ik may be also be measured via a further current mirror as described in conjunction with FIG. 4.

When the magnitude of the voltage between nodes 618, 620 is lower than the further protection voltage Vp2, no further shunt current Ik will flow as the voltage is not large enough to reverse bias one of the diodes in the diode pairs. Voltage Vm2 may then have the same shape as voltage Vi provided by the interface 102.

The signals S1, S2 and S3 may be processed and evaluated as described in conjunction with FIG. 5.

Figure 7:
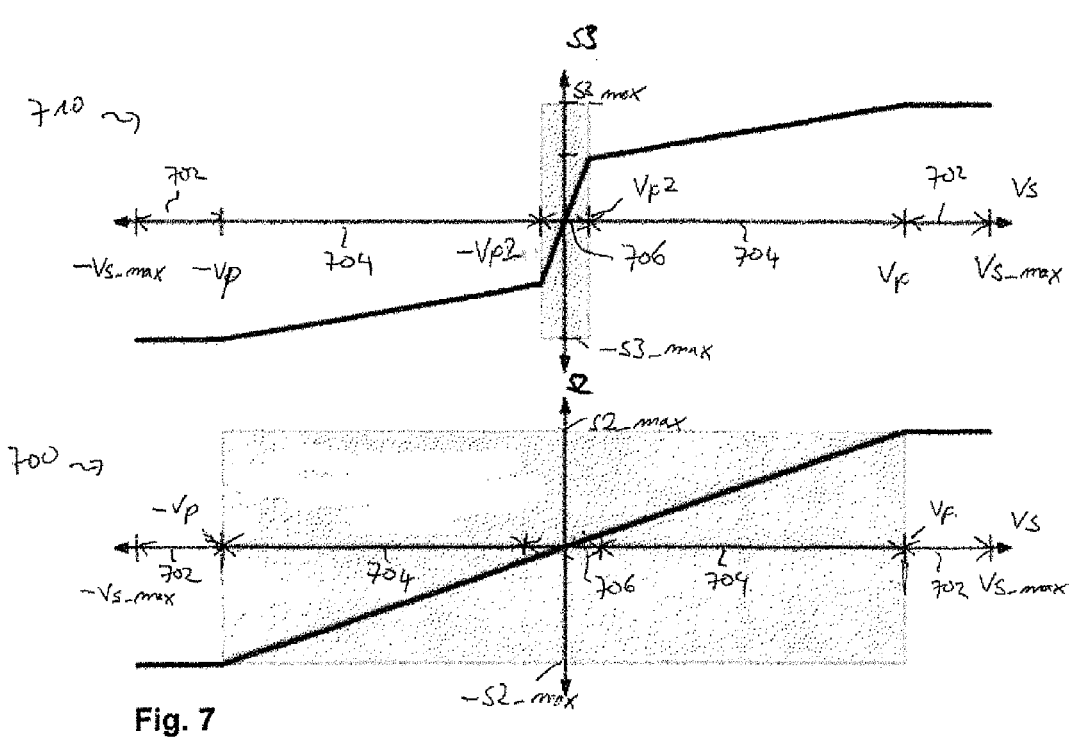
FIG. 7 shows signals of a second measurement type and of a third measurement type in accordance with various embodiments.

FIG. 7 shows a diagram 700 of a signal S2 of the second measurement type and a diagram 710 of a signal S3 of the third measurement type of an embodiment. Signal Vs may be a sensor signal, as described above. +Vs_max may be the maximum value of signal Vs and −Vs_max may be the minimum value of signal Vs. Vp may be a protection voltage, for example, of protecting circuit 106. It may for example be a maximum allowable electronic discharge voltage (ESD) of electronic devices used in the circuit arrangement. It may be about 25 V or 50 V. Vp2 may be a further protection voltage, for example, of further protecting circuit 408. It may be chosen so that signals Vs with small amplitudes—occurring for example at low speeds of rotation, for example at start-up or idling of an internal combustion engine—may be measured with high resolution. The further protection voltage Vp2 may be about 1.5 V or 3.0 V or something else.

In a first operating area 702, signal Vs may be in the range from −Vs_max to −Vp and in the range from +Vp to +Vs_max. For illustrative purposes, it may be assumed that Vi=Vs, that is, that there is no significant voltage drop in the interface 102. Signals S2 and S3 will then be horizontal lines, that is parallel to the Vs axis, in the first operating area 702. The signal Vs may be clipped by the protection circuit 106 to the protection voltage Vp. Signal S2 will not exceed a maximum value S2_max and will not fall below a minimum value −S2_max. Further protection circuit 408 may also clip a voltage provided at its input. Signal S3 will not exceed a maximum value S3_max and will not fall below a minimum value −S3_max.

The signal S2 and signal S3 may be scaled by the first voltage measurement circuit 504 and the second voltage measurement circuit 506, respectively. The scaling of signal S2 may be chosen so that the magnitudes of signal S2_max and −S2_max are in a range of measurement for high speeds of revolution. The scaling of signal S3 may be chosen so that the magnitudes of signal −S3_max and signal S3_max are in a range of measurement for low speeds of revolution.

In the first operating area 702, a first measurement type may be performed. The first measurement type may for example be a current measurement through the protection circuit 106, or a current measurement through the further protection circuit 408, or current measurements through both the protection circuit 106 and the further protection circuit 408. The protection circuit 106 may shunt the signal Vs. The further protection circuit 408 may also shunt a signal at its input. A current may flow through the protection circuit 106 and the further protection circuit 408 and signal S1 may represent at least one of the current flows. The situation may be the same as in the diagrams 200, 210 described in conjunction with FIG. 2, with the first operating area 702 corresponding to the first operating area 202 and the second operating area 204. However, as mentioned above, signals S2 and S3 have been shown as horizontal line in the first operating area 702.

In a second operating area 704, the signal Vs may be between −Vp and −Vp2 and between +Vp2 and +Vp. Signal Vs will not be clipped by the protection circuit 106 since signal Vs has a magnitude that is smaller than the magnitude of the protection voltage Vp. Signal S2 may have the same shape or waveform as signal Vs and may be proportional to it. However, the further protection circuit 408 may still clip a voltage provided at the input of the further protection circuit 408. The slope of signal S3 may be caused by the coupling of the further protection circuit 408 to voltage Vs. For example, the slope may be caused by voltage drops along resistors R2, R3 and R11, R12 shown in FIG. 6.

In the second operating area 704, a first measurement type may be performed. The first measurement type may for example be a current measurement through the further protection circuit 408. The further protection circuit 408 may shunt a signal whenever signal Vs and the voltage drops along the coupling is greater than the further protection voltage Vp2 or lower than the further protection voltage −Vp2. A current may flow through the further protection circuit 408, and signal S1 may represent the current flow. The situation may be the same as in diagrams 200, 210 described in conjunction with FIG. 2, with the second operating area 704 corresponding to the first operating area 202 and the second operating area 204.

In a third operating area 706, the signal Vs may be in the range from −Vp2 to +Vp2. The signal Vs will not be clipped by the protection circuit 106 or the further protection circuit 408 since signal Vs has a magnitude that is smaller than the magnitude of the protection voltage Vp and smaller than the magnitude of the further protection voltage Vp2. Signal S2 and signal S3 may have the same shape or waveform as signal Vs and may be proportional to it. No current is shunted and it may not be possible to perform a first measurement type. Signal S1 may be zero in the third operating area 706. The situation may be the same as in diagrams 200, 210 described in conjunction with FIG. 2, with the third operating area 706 corresponding to the third operating area 206.

Figure 8:
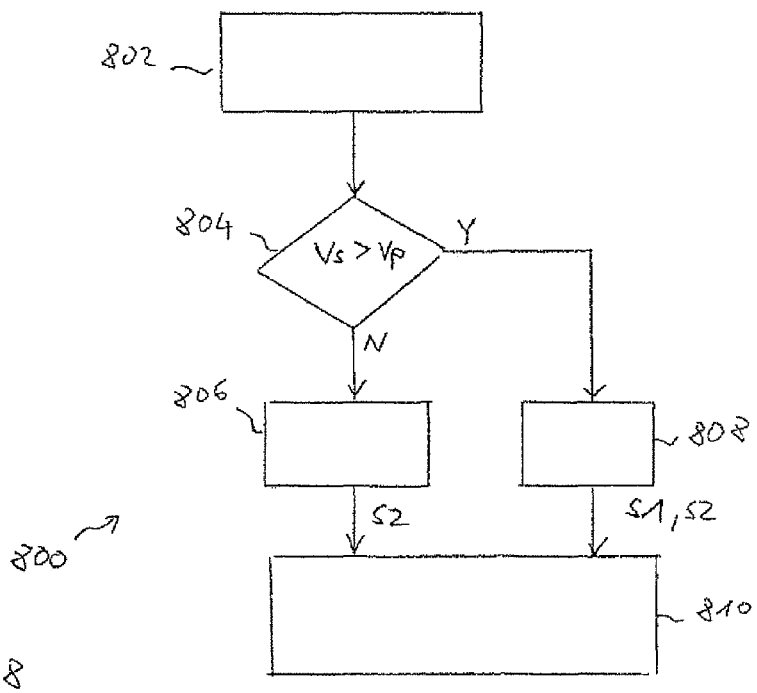
FIG. 8 shows a method for evaluating a signal in accordance with various embodiments.

FIG. 8 shows an embodiment of a method for evaluating a signal, for example, for evaluating a sensor signal. The method may include processes 802, 804, 806, 808, 810.

In 802, a signal may be provided, for example by means of a sensor. The sensor may be any kind of sensor. It may be a variable reluctance sensor.

In 804, it may be determined if the voltage of the signal is greater than a protection voltage. The protection voltage may be determined by a protection circuit which may limit or clip the voltage of the signal to the protection voltage. If the voltage of the signal is smaller than the protection voltage, the flow may continue with 806. If the voltage of the signal is greater than the protection voltage, the flow may continue with 808.

In 806, a voltage representing the signal may be measured. A signal S2 corresponding to the voltage representing the signal may be output. The voltage representing the signal may be a voltage across the protection circuit. The representation of the signal may be achieved by a voltage divider.

In 808, the voltage of the signal may be limited to the protection voltage by means of a shunt current and at least one of the shunt current and the voltage representing the limited signal may be measured. The voltage may be limited or clipped in magnitude by the protection circuit to less or equal to the protection voltage Vp. A signal S1 corresponding to the shunt current may be output. The shunt current may flow through the protection circuit. The shunt current may be measured by measuring a voltage across a known resistor or by a current mirror. A voltage representing the limited signal may be measured. A signal S2 corresponding to the voltage representing the limited signal may be output. The voltage representing the limited signal may be a voltage across the protection circuit. The representation of the voltage of the limited signal may be achieved by a voltage divider. The shunt current and the voltage representing the limited signal may both be measured and both signal S1 and signal S2 may be output. The measurement of the shunt current and the voltage representing the limited signal may occur simultaneously.

In 810, at least one of the signals S1 and S2 is evaluated. The evaluation may depend on whether the voltage is limited in magnitude or not. If both signals S1 and S2 are output, they may be combined to increase the signal-to-noise ratio SNR of the voltage by compensating noise present in both the shunt current and the voltage representing the limited signal.

While signal Vi has been shunted between the two input lines directly as shown in FIG. 3 or shunted to a ground potential as shown in FIG. 6, it may also be shunted to another potential, for example a supply potential, for example of the circuit arrangement.

While the embodiments have been described for evaluating differential signals, they may also be used for evaluating single-ended signals, that is signals which have a reference to a fixed potential, such as for example a ground potential.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
   an interface configured to receive a signal;
   a protection circuit coupled to the interface, wherein the protection circuit is configured to limit a voltage provided by the interface to a protection voltage;
   a measurement circuit coupled to the protection circuit and configured to provide at least one of a signal of a first measurement type and a signal of a second measurement type if a voltage provided by the interface is higher than the protection voltage; and
   configured to provide a signal of a second measurement type if the voltage provided by the interface is lower than the protection voltage.

2. The circuit arrangement according to claim 1,
   wherein the first measurement type represents a current through the protection circuit.

3. The circuit arrangement according to claim 1,
   wherein the second measurement type represents a voltage.

4. The circuit arrangement according to claim 1,
   wherein the protection circuit comprises at least one reverse biased diode, wherein the reverse biased diode is coupled to the voltage provided by the interface.

5. The circuit arrangement according to claim 4,
   wherein the at least one reverse biased diode comprises at least one zener diode,
   wherein the zener diode is coupled to the voltage provided by the interface.

6. The circuit arrangement according to claim 1,
   wherein the protection circuit comprises at least two reverse biased diodes,
   wherein the at least two reverse biased diodes are coupled in series between the voltage provided by the interface.

7. The circuit arrangement according to claim 6,
   wherein the at least two reverse biased diodes comprise at least two zener diodes,
   wherein the at least two zener diodes are coupled in series between the voltage provided by the interface.

8. The circuit arrangement according to claim 1,
   wherein the protection circuit comprises at least one transistor, wherein the transistor is coupled to the voltage provided by the interface and configured to shunt the voltage provided by the interface.

9. The circuit arrangement according to claim 1,
   wherein the protection circuit comprises at least two transistors, wherein the transistors are coupled in series between the voltage provided by the interface and are configured to shunt the voltage provided by the interface.

10. The circuit arrangement according to claim 4,
    wherein the measurement circuit comprises at least one resistor coupled in series with the at least one reverse biased diodes or the at least one transistor, wherein a voltage across the resistor is provided as the signal of the first measurement type.

11. The circuit arrangement according to claim 4,
    the measurement circuit comprises a current mirror configured to mirror a current through the at least one reverse biased diodes or the at least one transistor to provide the signal of the first measurement type.

12. The circuit arrangement according to claim 1, further comprising:
    at least one further protection circuit coupled to the interface, wherein the at least one further protection circuit is configured to limit a voltage provided by the interface to a at least one further protection voltage.

13. The circuit arrangement according to claim 12,
    wherein the at least one further protection circuit is coupled to the voltage provided by the interface by at least one resistor.

14. The circuit arrangement according to claim 13,
    wherein the at least one further protection circuit comprises one of at least one reverse biased diode, at least one zener diode and at least one transistor configured to shunt the voltage provided by the interface.

15. The circuit arrangement according to claim 14,
    the measurement circuit comprises a current mirror configured to mirror a current through the at least one reverse biased diodes, the at least one zener diode or the at least one transistor to provide the signal of the first measurement type.

16. The circuit arrangement according to claim 14,
    wherein the measurement circuit comprises at least one resistor coupled in series with the at least one reverse biased diodes or the at least one transistor, wherein a voltage across the resistor is provided as the signal of the first measurement type.

17. The circuit arrangement according to claim 12,
    wherein the measurement circuit is configured to perform at least one of at least a first measurement type and at least one of a second measurement type.

18. The circuit arrangement according to claim 1, further comprising:
    a variable reluctance sensor configured to provide the signal.

19. A method for evaluating a signal, the method comprising
 measuring a voltage representing the signal if a voltage of the signal is lower than a protection voltage;
 limiting the voltage of the signal to the protection voltage by means of a shunt current and measuring at least one of the shunt current and a voltage representing the limited signal if the voltage of the signal is higher than the protection voltage; and
 both the shunt current and the voltage representing the limited signal are measured if the voltage of the signal is higher than the protection voltage.

20. The method of claim 19, wherein
 the measured shunt current is used to compensate for information that is lost in limiting the voltage of the signal.

21. A method for evaluating a signal, the method comprising
 measuring a voltage representing the signal if a voltage of the signal is lower than a protection voltage;
 limiting the voltage of the signal to the protection voltage by means of a shunt current and measuring at least one of the shunt current and a voltage representing the limited signal if the voltage of the signal is higher than the protection voltage;
 measuring a further voltage representing the signal if a voltage of the signal is lower than a further protection voltage; and
 limiting the further voltage representing the signal to the further protection voltage by means of a shunt current and measuring at least one of the shunt current and a voltage representing the limited signal if the voltage of the signal is higher than the further protection voltage.

22. The method of claim 21, wherein
 both the shunt current and the voltage representing the limited signal are measured if the voltage of the signal is higher than the protection voltage.

23. The method of claim 22, wherein
 the measured shunt current is used to compensate for information that is lost in limiting the voltage of the signal.

* * * * *